US010811969B2

(12) United States Patent
Dharmalinggam et al.

(10) Patent No.: US 10,811,969 B2
(45) Date of Patent: *Oct. 20, 2020

(54) CONSTANT ON-TIME CONVERTER WITH FREQUENCY CONTROL

(71) Applicant: Silanna Asia Pte Ltd, Singapore (SG)

(72) Inventors: Rawinder Dharmalinggam, Singapore (SG); Tiong Lim, Singapore (SG)

(73) Assignee: Silanna Asia Pte Ltd, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/565,901

(22) Filed: Sep. 10, 2019

(65) Prior Publication Data

US 2020/0220460 A1 Jul. 9, 2020

Related U.S. Application Data

(63) Continuation of application No. 16/240,155, filed on Jan. 4, 2019, now Pat. No. 10,418,902.

(51) Int. Cl.
| | | |
|---|---|---|
| *H02M 3/157* | (2006.01) | |
| *H02M 3/158* | (2006.01) | |
| *H03K 7/08* | (2006.01) | |
| *H02M 1/00* | (2006.01) | |

(52) U.S. Cl.
CPC .......... *H02M 3/158* (2013.01); *H02M 3/157* (2013.01); *H03K 7/08* (2013.01); *H02M 2001/0003* (2013.01)

(58) Field of Classification Search
CPC ...... H02M 3/156; H02M 3/157; H02M 3/158; H02M 3/1588
See application file for complete search history.

(56) References Cited

U.S. PATENT DOCUMENTS

| | | | |
|---|---|---|---|
| 5,748,460 A | 5/1998 | Ishikawa et al. | |
| 9,024,606 B2* | 5/2015 | Adell | H02M 3/1588 |
| | | | 323/283 |
| 9,762,130 B2 | 9/2017 | Kawashima et al. | |

(Continued)

FOREIGN PATENT DOCUMENTS

KR  1020130019741 A  2/2013

OTHER PUBLICATIONS

"3A, 18V, 700kHz ACOTTM Synchronous Step-Down Converter,", Richtek DS7275-76-05, RT7275/76, Feb. 2018, pp. 1-24, Richtek.com.

(Continued)

*Primary Examiner* — Gary L Laxton
(74) *Attorney, Agent, or Firm* — MLO, a professional corp.

(57) ABSTRACT

An improved power converter produces power through a power switch in response to an activation signal that has an on-time and a switching frequency. An on-time signal has a constant on-time and controls the on-time of the activation signal. An error signal indicates that the switching frequency is not equal to a reference frequency. A step up signal and a step down signal are based on the error signal. A count signal is increased in response to the step up signal and decreased in response to the step down signal. An on-time pulse has a duration that is related to a value of the count signal. The on-time pulse controls the constant on-time of the on-time signal and maintains the switching frequency at about the reference frequency.

20 Claims, 11 Drawing Sheets

(56) References Cited

U.S. PATENT DOCUMENTS

| | | |
|---|---|---|
| 10,418,902 B1 * | 9/2019 | Dharmalinggam .................... H02M 1/0061 |
| 2005/0007087 A1 | 1/2005 | Pullen et al. |
| 2009/0009148 A1 | 1/2009 | Philbrick |
| 2011/0109398 A1 | 5/2011 | Tang et al. |
| 2014/0153292 A1 | 6/2014 | Yan et al. |
| 2016/0218630 A1 | 7/2016 | Huang et al. |

OTHER PUBLICATIONS

"Comparing Buck Converter Topologies", Richtek Technologies, Jan. 2015, pp. 1-10, https://www.richtek.com/en/Design%20Support/Technical%20Document/AN032.

Choudhary, Vijay; "Simplifying Wide Input Voltage DC-DC Converter Design with COT Topology," Jul. 2014, pp. 1-15, https://www.ecnmag.com/article/2014/07/simplifying-wide-input-voltage-dc-dc-converter-design-cot-topology.

Notice of Allowance dated May 15, 2019 for U.S. Appl. No. 16/240,155.

International Search Report dated Apr. 14, 2020 for PCT Patent Application No. PCT/IB2019/061140.

* cited by examiner

CONSTANT ON-TIME CONVERTER WITH FREQUENCY CONTROL

CROSS-REFERENCE TO RELATED APPLICATION

This application is a continuation of U.S. Non-Provisional application Ser. No. 16/240,155, filed Jan. 4, 2019, all of which is incorporated by reference herein in its entirety.

BACKGROUND

A constant-on-time (COT) regulator, or power converter, generally produces an output voltage from an input voltage through a power switch, such as a transistor. The power switch is typically controlled by operation of a feedback comparator and an on-time circuit, which cause the power switch to be turned on and off. The on-time for the power switch is generally held constant by the on-time circuit, during which time an output inductor and output capacitor are charged up by the input voltage to provide power to a load, and the output voltage increases. At the end of the on-time, the power switch is turned off, and the output voltage decreases. The off-time for the power switch may vary, depending on how quickly a feedback voltage (based on the decreasing output voltage) drops below a reference voltage, as determined by the feedback comparator. When the feedback comparator determines that the feedback voltage has fallen below the reference voltage, the power switch is turned back on for the duration of the on-time, and this on-off cycle repeats.

The on-off cycle results in the output voltage having a frequency component. During steady state operation, i.e., when the load does not vary significantly, the on-off cycle exhibits a relatively steady switching frequency. The switching frequency of the output voltage can cause undesirable harmonics in other components of an overall electronic circuitry due to electromagnetic interference. For some types of electronic circuitry, therefore, it is desirable to ensure that the switching frequency of the output voltage is maintained at a known desired value that will not unduly affect the other components in the overall circuitry.

The switching frequency is dependent on several factors, including the duration of the on-time. It is, thus, possible to ensure a certain frequency during steady state operation by adjusting the on-time. Some other factors that can affect the frequency are caused by various component parameters that result in propagation delays, deadtimes, and losses within some of the components of the power converter. Some of these factors are not very significant when the on-time is relatively long, in which case, a common relationship between the frequency and the on-time provides for a general design formula for determining the appropriate component values for the power converter circuitry. However, when the on-time is relatively short, e.g., approaching 100 ns or less, the general design formula does not apply, due to a greater relative effect of the various propagation delays, deadtimes, and losses within some of the components. In other words, at a relatively short on-time (i.e., a low duty cycle with a relatively high switching frequency), the typical circuit design can result in a switching frequency that is substantially different from the desired value, such that there is a higher risk that it can unduly affect the other components in the overall circuitry.

Additionally, when a transient occurs (e.g., a sudden and significant change in either the load or the input voltage), the switching frequency can undergo substantial instability, or fluctuations, before settling back into steady state operation. Although this instability is temporary, it is desirable for the switching frequency to settle into steady state operation relatively quickly.

SUMMARY

In accordance with some embodiments, an improved power converter includes an output, a power switch, a constant on-time feedback loop, a frequency error detector, a filter, a counter, and a pulse generator. An output voltage is produced at the output. Power is produced through the power switch for the output voltage in response to an activation signal that has an on-time and a switching frequency. The constant on-time feedback loop receives a feedback signal from the output and generates an on-time signal in response to the feedback signal. The on-time signal has a constant on-time and controls the on-time of the activation signal. The frequency error detector produces an error signal indicating that the switching frequency is not equal to a reference frequency. The filter is configured to produce a step up signal and a step down signal based on the error signal. The counter produces a count signal and is configured to increase the count signal in response to the step up signal and to decrease the count signal in response to the step down signal. The pulse generator produces an on-time pulse having a duration that is related to a value of the count signal. The pulse generator provides the on-time pulse to the constant on-time feedback loop to control the constant on-time of the on-time signal and to maintain the switching frequency at about the reference frequency.

In accordance with some embodiments, an improved method involves generating an output voltage by a power switch of a power converter in response to an activation signal that has an on-time and a switching frequency; providing a feedback signal based on the output voltage; generating an on-time signal based on the feedback signal, the on-time signal having a constant on-time; controlling, based on the on-time signal, the on-time of the activation signal; producing an error signal indicative of whether the switching frequency is lower than or greater than a reference frequency; producing a step up signal and a step down signal based on the error signal; producing a count signal by increasing the count signal in response to the step up signal and decreasing the count signal in response to the step down signal; producing an on-time pulse having a duration that is related to a value of the count signal; and controlling, based on the on-time pulse, the constant on-time of the on-time signal, the controlling of the constant on-time resulting in maintaining the switching frequency at about the reference frequency.

In some embodiments, the step up signal is based on an overlap of the error signal and a switching signal having a frequency based on the switching frequency; and the step down signal is based on an overlap of the error signal and a reference signal having a frequency based on the reference frequency. In some embodiments, a low-error signal is produced when the error signal and the switching signal overlap, the low-error signal indicating that the switching frequency is lower than the reference frequency; the step up signal is based on the low-error signal; a high-error signal is produced when the error signal and the reference signal overlap, the high-error signal indicating that the switching frequency is higher than the reference frequency; and the step down signal is based on the high-error signal. In some embodiments, the step up signal is produced after N pulses of the low-error signal; and the step down signal is produced after N pulses of the high-error signal. In some embodiments, the N pulses of the low-error signal are consecutive; and the N pulses of the high-error signal are consecutive. In some embodiments, a counting of the N consecutive pulses of the low-error signal is reset when any pulse of the low-error signal is immediately followed by a pulse of the high-error signal; and a counting of the N consecutive pulses of the high-error signal is reset when any pulse of the high-error signal is immediately followed by a pulse of the low-error signal. In some embodiments, all or a portion of the error signal is blanked; the step up signal and the step down signal are produced when only the portion of the error signal is blanked; and the step up signal and the step down signal are not produced when the error signal is all blanked. In some embodiments, the error signal is produced only once every four cycles of the switching signal or the reference signal; a first edge of the reference signal is synchronized with a corresponding first edge of the switching signal immediately prior to a cycle in which the error signal is produced; and the error signal is produced at a time period between a second edge of the reference signal and a corresponding second edge of the switching signal.

DETAILED DESCRIPTION

Figure 1:
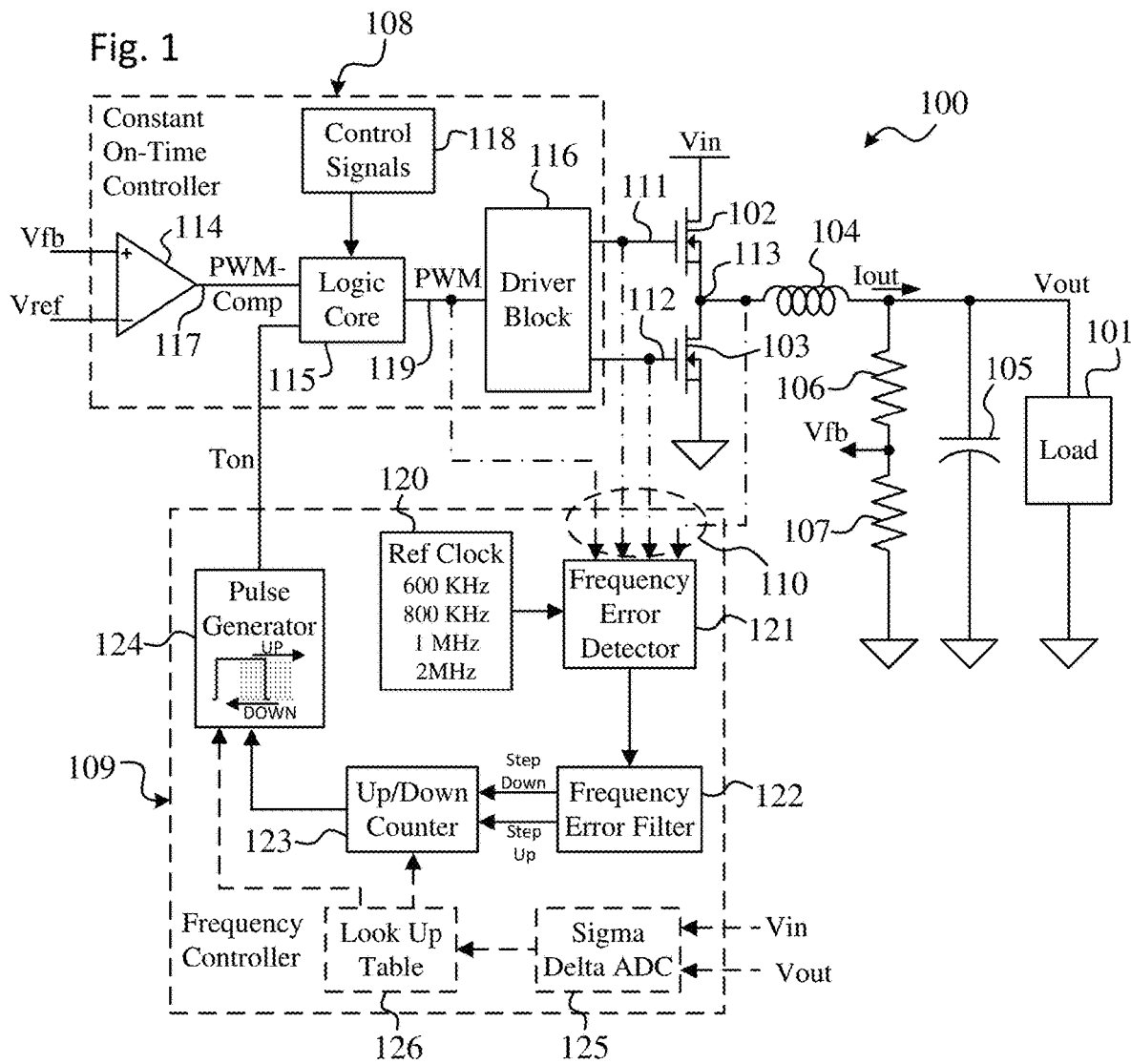
FIG. 1 is a simplified schematic diagram of a power converter, in accordance with some embodiments.

An improved constant on-time (COT) power converter 100 is shown in FIG. 1 for providing electrical power (i.e., with an output voltage Vout and output current Iout) to a load 101 from a supply voltage (e.g., an input voltage Vin), in accordance with some embodiments. The power converter 100 generally includes a constant on-time feedback loop and a frequency control loop (frequency locked loop, FLL) that provide for control of the switching frequency of the output voltage Vout, so that the switching frequency returns to (i.e., at or near) a predetermined frequency relatively quickly upon reaching steady state conditions after a transient occurs, e.g., when the load 101 or the input voltage Vin undergoes a sudden significant change. Additionally, the power converter 100 includes improved features that enable greater stability in, or faster settling by, the switching frequency, such that large fluctuations in the switching frequency are minimized in amplitude, severity and/or duration as the switching frequency returns to the predetermined frequency. In this manner, undesirable harmonics due to electromagnetic interference in the power converter 100 or in other components of an overall electronic circuitry (e.g., within the load 101 or other circuitry within which the power converter 100 is included) are mitigated, minimized or eliminated. The present invention is, thus, advantageous for use in overall electronic circuitry wherein a known constant or fixed switching frequency is desirable such that it will not interfere with other components of the circuitry, e.g., in radio or telecommunication markets.

The power converter 100 generally includes high side and low side power switches (or power FETs) 102 and 103, an output inductor 104, an output capacitor 105, a feedback voltage divider (resistors 106 and 107), a constant on-time controller 108 (i.e., for the constant on-time feedback loop), and a frequency controller 109 (i.e., for the frequency control loop) connected as shown. Additionally, other components may be included in the power converter 100 but are not shown for simplicity.

Operation of the power switches 102 and 103 generally provides electrical power from the input voltage Vin, through the output inductor 104 and across the output capacitor 105 (connected to ground) to produce the output current Iout at the output voltage Vout. The feedback voltage divider 106 (connected to ground) generates a voltage feedback signal Vfb (from between the resistors 106 and 107) from the output voltage Vout. The voltage feedback signal Vfb is provided to the constant on-time controller 108. Additionally, a switching signal 110 is provided from an appropriate location or node, as described below, to the frequency controller 109. The voltage feedback signal Vfb and the switching signal 110 enable the constant on-time controller 108 and the frequency controller 109 to coordinate or adjust the operation of the power switches 102 and 103 to ensure that the output voltage Vout is provided at a predetermined relatively constant voltage level, the output current Iout is provided at the appropriate current level for powering the load 101, and the switching frequency at which the output voltage Vout and output current Iout oscillate is maintained at the predetermined frequency or returned to the predetermined frequency relatively quickly and/or with minimal instability upon the occurrence of transients in the load 101 or the input voltage Vin, as described below.

The power switches 102 and 103 are controlled by a high side gate signal at 111 and a low side gate signal at 112, respectively, i.e., activation signals that have an on-time, an off-time, and a switching frequency. The gate signals at 111 and 112 switch the power switches 102 and 103 on and off to control the power or voltage applied to a phase node 113 at a connection between the power switches 102 and 103. Generally, the high side gate signal at 111 turns on the high side power switch 102 while the low side gate signal at 112 turns off the low side power switch 103; and the low side gate signal at 112 turns on the low side power switch 103 while the high side gate signal at 111 turns off the high side power switch 102. When the high side gate signal at 111 turns on the high side power switch 102, the input voltage Vin is applied to the phase node 113, the output inductor 104 and output capacitor 105 are charged, and the output voltage Vout increases. When the low side gate signal at 112 turns on the low side power switch 103, a ground is applied to the phase node 113, the output inductor 104 and output capacitor 105 are discharged, and the output voltage Vout decreases. The voltage at the phase node 113 (highly variable between the input voltage Vin and ground) is smoothed out by the output inductor 104 and the output capacitor 105 to produce the output current Tout at the output voltage Vout with relatively small ripple (increase and decrease) for application to the load 101.

In general, the constant on-time controller 108 generates the high side gate signal at 111 to turn on the high side power switch 102 and turns off the low side gate signal at 112 to turn off the low side power switch 103, so that the output voltage Vout will increase, for the duration of a constant on-time of a pulse width modulation (PWM) signal. Additionally, when the on-time of the PWM signal expires, the constant on-time controller 108 turns off the high side gate signal at 111 to turn off the high side power switch 102 and generates the low side gate signal at 112 to turn on the low side power switch 103, so that the output voltage Vout will decrease, for the duration of an adjustable off-time of the PWM signal. As the output voltage Vout increases and decreases, the feedback voltage Vfb also increases and decreases accordingly. When the feedback voltage Vfb decreases below the reference voltage Vref, the constant on-time controller 108 adjusts the off-time to be shorter, so that it turns on the high side gate signal at 111 sooner, or more often, thereby bringing up the output voltage Vout. On the other hand, when the feedback voltage Vfb increases above the reference voltage Vref, the constant on-time controller 108 adjusts the off-time to be longer, so that it turns on the high side gate signal at 111 later, or less often, thereby bringing down the output voltage Vout. In this manner, the output voltage Vout is held relatively constant (i.e., with relatively small ripple), the output current Tout is held relatively constant during steady state conditions, and the output current Tout also increases and decreases in accordance with transient changes in the load 101.

In some embodiments, the constant on-time controller 108 generally includes a comparator 114, a logic core 115, and a driver block 116 connected as shown. Additionally, other components may be included in the constant on-time controller 108 but are not shown for simplicity.

The comparator 114 receives the feedback voltage Vfb at a positive input and receives the reference voltage Vref at a negative input. An output 117 of the comparator 114 is a raw voltage feedback loop pulse width modulation (PWM) signal (PWM-Comp signal) based on the relative voltage levels of the feedback voltage Vfb and the reference voltage Vref. Thus, when the feedback voltage Vfb is greater than the reference voltage Vref, the PWM-Comp signal at 117 is a first logic level, e.g., logic high. When the feedback voltage Vfb is less than the reference voltage Vref, the PWM-Comp signal at 117 is a second logic level, e.g., logic low. The PWM-Comp signal at 117 is, thus, a PWM control signal generated in response to the feedback signal. The PWM-Comp signal at 117 generally controls the off-time of the gate signal at 111 and the on-time of the gate signal 112 (through the logic core 115 and the driver block 116 and as modified by an on-time pulse Ton from the frequency controller 109 to control the on-time of the gate signal at 111 and the off-time of the gate signal 112, as described below). Under steady state operating conditions, the PWM-Comp signal at 117 generally has a constant on-time. The on-time of the high side gate signal at 111 is generally directly related to the on-time of the PWM-Comp signal at 117 (as modified). The PWM-Comp signal at 117 is provided to an input of the logic core 115.

The logic core 115 receives the PWM-Comp signal at 117 from the comparator 114 and the on-time pulse Ton from the frequency controller 109. The logic core 115 also receives various control signals 118, described below. In response to the PWM-Comp signal at 117, the on-time pulse Ton, and the control signals 118, the logic core 115 produces a PWM-signal 119. The PWM-signal 119 is an adaptive on-time signal generated in response to the PWM-Comp signal at 117 and the on-time pulse Ton. The logic core 115 operates such that a duration of the on-time (i.e., the duty cycle) of the PWM-signal 119 is based on or set by the duration of the on-time pulse Ton. Thus, the PWM-signal 119 generally represents the PWM-Comp signal at 117 as modified by the on-time pulse Ton. The PWM-signal 119 generally controls the on-time and off-time of the gate signals at 111 and 112 (through the driver block 116). Under steady state operating conditions, the PWM-signal 119 generally has a constant on-time. The PWM-signal 119 is provided to an input of the driver block 116. An example embodiment of the logic core 115 is described in more detail below with respect to FIG. 12.

The driver block 116 receives the PWM-signal 119. In response to the PWM-signal 119, the driver block 116 generates the gate signals at 111 and 112. The on-time and off-time of the high side gate signal at 111 is generally directly related to the on-time and off-time, respectively, of the PWM-signal 119; and the off-time and on-time of the low side gate signal at 112 is generally directly related to the on-time and off-time, respectively, of the PWM-signal 119.

In some embodiments, the frequency controller 109 generally includes a reference clock 120, a frequency error detector 121, a frequency error filter 122, an up/down counter 123, and a pulse generator 124 connected as shown. Additionally, in some embodiments, the frequency controller 109 optionally includes a sigma delta ADC (analog-to-digital converter) 125 and a look up table (LUT) 126 also connected as shown. Additionally, other components may be included in the frequency controller 109 but are not shown for simplicity.

In some embodiments, the reference clock 120 generates a reference clock signal (or reference signal) and provides it to the frequency error detector 121. The reference clock signal may be at any desired frequency, e.g., 600 KHz, 800 KHz, 1 MHz, 2 MHz, etc. (as set, for example, by a trim bit or external resistor configuration), at which the output voltage Vout is expected to oscillate for the desired performance of the power converter 100 and the least electromagnetic interference. In some embodiments, the frequency of the reference clock signal may be based on or related to the desired frequency, instead of being at the actual desired frequency. For example, the reference clock signal may be divided down to a lower frequency for use with the frequency error detector 121. In some embodiments, the reference clock 120 receives a control signal indicating the desired frequency at which to produce the reference clock signal. In some embodiments, however, the source of the reference clock signal is external to the power converter 100, in which case the illustrated reference clock 120 represents this external source. An example embodiment of the reference clock 120 and its operation are described in more detail below with respect to FIGS. 5 and 6.

In some embodiments, the frequency error detector 121 receives the reference clock signal from the reference clock 120 and the switching signal 110 from an appropriate location or node in the power converter 100 and generates or produces an error signal based thereon. Four alternatives are shown in dashed lines for providing the switching signal 110, since the voltage at each of these nodes would generally oscillate at about the same frequency as that of the output voltage Vout, but only one of these connections would be implemented. Alternative sources for the switching signal 110 include the phase node 113, the PWM-signal 119, the high side gate signal at 111, or the low side gate signal at 112. Since the voltage oscillation at the phase node 113 directly drives the output voltage Vout, the phase node voltage would most closely match the timing of the oscillations of the output voltage Vout. The error signal produced by the frequency error detector 121 generally indicates that the switching frequency of the switching signal 110 (and thus of the output voltage Vout) is not equal to the frequency of the reference clock signal (i.e., a reference frequency), i.e., that the switching frequency is either too high or too low compared to the reference frequency. The error signal may be produced directly from the switching signal 110 and the reference clock signal or from signals that are based on or related to the switching signal 110 and the reference clock signal (i.e., signals having frequencies that are based on or related to the switching frequency of the switching signal 110 and the reference frequency of the reference clock signal). For example, in some embodiments, the error signal may be produced from signals having frequencies that are divided down from those of the switching signal 110 and the reference clock signal. Additionally, in some embodiments, the frequency error detector 121 produces the error signal only once in a predetermined number (e.g., 2, 3 or 4) of cycles of the switching signal or the reference clock signal, as described below. The frequency error detector 121 provides the error signal to the frequency error filter 122. An example embodiment of the frequency error detector 121 and its operation are described in more detail below with respect to FIGS. 2-4 and 6.

The frequency error filter 122 generally receives the error signal along with the switching signal 110 and the reference clock signal (or along with the signals that are based on or related to the switching signal 110 and the reference clock signal) and produces a "step up" signal and a "step down" signal based thereon, as described below. Additionally, only one of these "step" signals is produced at any given time, and sometimes neither is produced. The step up signal generally indicates that the switching frequency of the switching signal 110 is too low compared to the reference frequency of the reference clock signal, so the frequency needs to be increased or stepped up; and the step down signal generally indicates that the switching frequency is too high compared to the reference frequency, so the frequency needs to be decreased or stepped down. Production of neither of the step signals generally indicates that the switching frequency is the same as or is relatively close to (i.e., within an acceptable range or tolerance) the reference frequency. The frequency error filter 122 provides the step up and step down signals to the up/down counter 123. The step up and step down signals are used to adjust the on-time pulse Ton to reduce the frequency error until the switching frequency is locked to the reference frequency. The FLL of the frequency controller 109, thus, causes the switching frequency to track the reference frequency during steady state operation. An example embodiment of the frequency error filter 122 and its operation are described in more detail below with respect to FIGS. 2 and 7-10.

The up/down counter 123 generally receives the step up and step down signals and produces or generates a count signal, as described below. The up/down counter 123 is configured to increase a value of the count signal in response to the step up signal and to decrease the value of the count signal in response to the step down signal. The up/down counter 123 provides the count signal to the pulse generator 124.

The pulse generator 124 produces or generates the on-time pulse Ton, as described below. A duration of the on-time pulse Ton is generally related to or directly proportional to the value of the count signal. Thus, the pulse generator 124 generally increases ("up") the on-time pulse Ton when the count signal increases and decreases ("down") the on-time pulse Ton when the count signal decreases. The pulse generator 124 provides the on-time pulse Ton to the logic core 115 of the constant on-time controller 108 (i.e., the frequency control loop provides the on-time pulse Ton to the constant on-time feedback loop) to control or modify the constant on-time of the PWM-signal 119 and to maintain the switching frequency of the switching signal 110 (and thus of the output voltage Vout) at about the reference frequency. Therefore, the on-time pulse Ton is based on the count signal, which is based on the step up and step down signals, which are based on the error signal, the switching signal 110 and the reference clock signal (or the signals that are based on or related to the switching signal 110 and the reference clock signal). In this manner, whereas the constant on-time controller 108 drives the power switches 102 and 103 with a constant on-time for the high side power switch 102, the frequency controller 109 causes the constant on-time controller 108 to set or modify this on-time to a duration or value that indirectly results in maintaining the switching frequency at about the reference frequency.

A conventional technique to set the constant on-time of the PWM-signal that drives power switches in a power converter is generally based on or proportional to a ratio of the output voltage Vout to the input voltage Vin (i.e., a quotient of the output voltage Vout divided by the input voltage Vin). A conventional design formula using this relationship then provides for determining appropriate component values (e.g., for components of a constant on-time feedback loop) for the power converter circuitry, which results in a switching frequency of the output voltage Vout relatively close to a desired switching frequency. However, when the on-time is relatively short (e.g., at or near 100 ns or less) or the switching frequency is relatively high (e.g., 600 KHz-2 MHz or higher), the typical circuit design resulting from the conventional design formula can result in a switching frequency that is substantially different from the desired switching frequency. This difference is generally due to the greater relative effect of the various propagation delays, deadtimes, and losses within some of the components (e.g., the comparator 114, the logic core 115, and the driver block 116) of the power converter when operating at the shorter on-time or higher frequency. Nevertheless, in some embodiments, the output voltage Vout and the input voltage Vin (and their general relationship to the on-time) can be used for a coarse setting of the on-time pulse Ton, thereby resulting in a coarse, or first order, setting of the switching frequency. The coarse setting can be done whenever the reference clock signal is changed, or upon power-on or reset of the power converter 100 (or the overall electronic circuitry), or when a significant transient occurs in the input voltage Vin, the output voltage Vout or the load 101. In some embodiments, the coarse setting is done by the sigma delta ADC 125 and the look up table 126. The coarse setting is then followed by a fine, or second order, tuning of the on-time pulse Ton (and, thus, of the switching frequency) by the FLL operation of the components 121-124.

The sigma delta ADC 125 generally receives the output voltage Vout and the input voltage Vin (or other voltage signals directly related thereto or based thereon). Based on these inputs, the sigma delta ADC 125 either generates a digital output that is indicative of or based on the output voltage Vout and the input voltage Vin (i.e., Vout and Vin values) or the ratio of the output voltage Vout to the input voltage Vin (i.e., a Vout/Vin value), or generates a stream of pulses representative of the Vout and Vin values or the Vout/Vin value. The sigma delta ADC 125 provides the digital output to the look up table 126.

The look up table 126 receives the digital output of the sigma delta ADC 125 and an indication of the selected or desired switching frequency (e.g., as set by the reference clock 120) and generates an initial Ton width output. If the digital output of the sigma delta ADC 125 is the Vout and Vin values, then the look up table 126 includes a variety of combinations of different values or ranges for the Vout and Vin values cross referenced with initial Ton width values. If the digital output of the sigma delta ADC 125 is the Vout/Vin value, then the look up table 126 includes several different values or ranges for the Vout/Vin value cross referenced with the initial Ton width values. Given the digital output of the sigma delta ADC 125, therefore, the look up table 126 produces a corresponding initial Ton width value as the initial Ton width output. The look up table 126 provides the initial Ton width output to the up/down counter 123 or the pulse generator 124. The on-time pulse Ton is thus made adaptive by the Vout and Vin values, since the sigma delta ADC 125 enables adjustment of the on-time pulse Ton by the pulse generator 124 relatively quickly after supply and/or load transients.

In some embodiments, therefore, the up/down counter 123 receives the initial Ton width output in addition to the step up and step down signals. Whenever, the initial Ton width value changes, the up/down counter 123 resets the count signal to a value based on the initial Ton width value. When the reset count signal propagates through to the pulse generator 124, the resulting on-time pulse Ton represents the coarse setting of the on-time pulse Ton. In other embodiments, the pulse generator 124 sets the width of the on-time pulse Ton accordingly when the initial Ton width value changes, so this setting represents the coarse setting of the on-time pulse Ton. After this resetting of the count signal or the on-time pulse Ton, the up/down counter 123 proceeds to adjust the count signal as described herein in accordance with the step up and step down signals. These adjustments represent the fine tuning of the on-time pulse Ton (and, thus, of the switching frequency) by the operation of the components 121-124.

The operation of the sigma delta ADC 125 and the look up table 126 is generally faster than that of the components 121-124, so that the coarse setting enables the frequency controller 109 to relatively rapidly cause the switching frequency to be set near to the desired reference frequency. Consequently, the subsequent adjustments by the components 121-124 do not have to make large changes to the on-time pulse Ton, which would otherwise likely cause unpredictable large swings or rings in the switching frequency that would take longer to settle to the desired reference frequency. The coarse setting, therefore, reduces the number of steps required and time to perform the subsequent fine tuning and adds to or assists with the overall stability or settling of the operations of the constant on-time controller 108 and the frequency controller 109 for managing the switching frequency, which results in a relatively good transient response.

Figure 2:
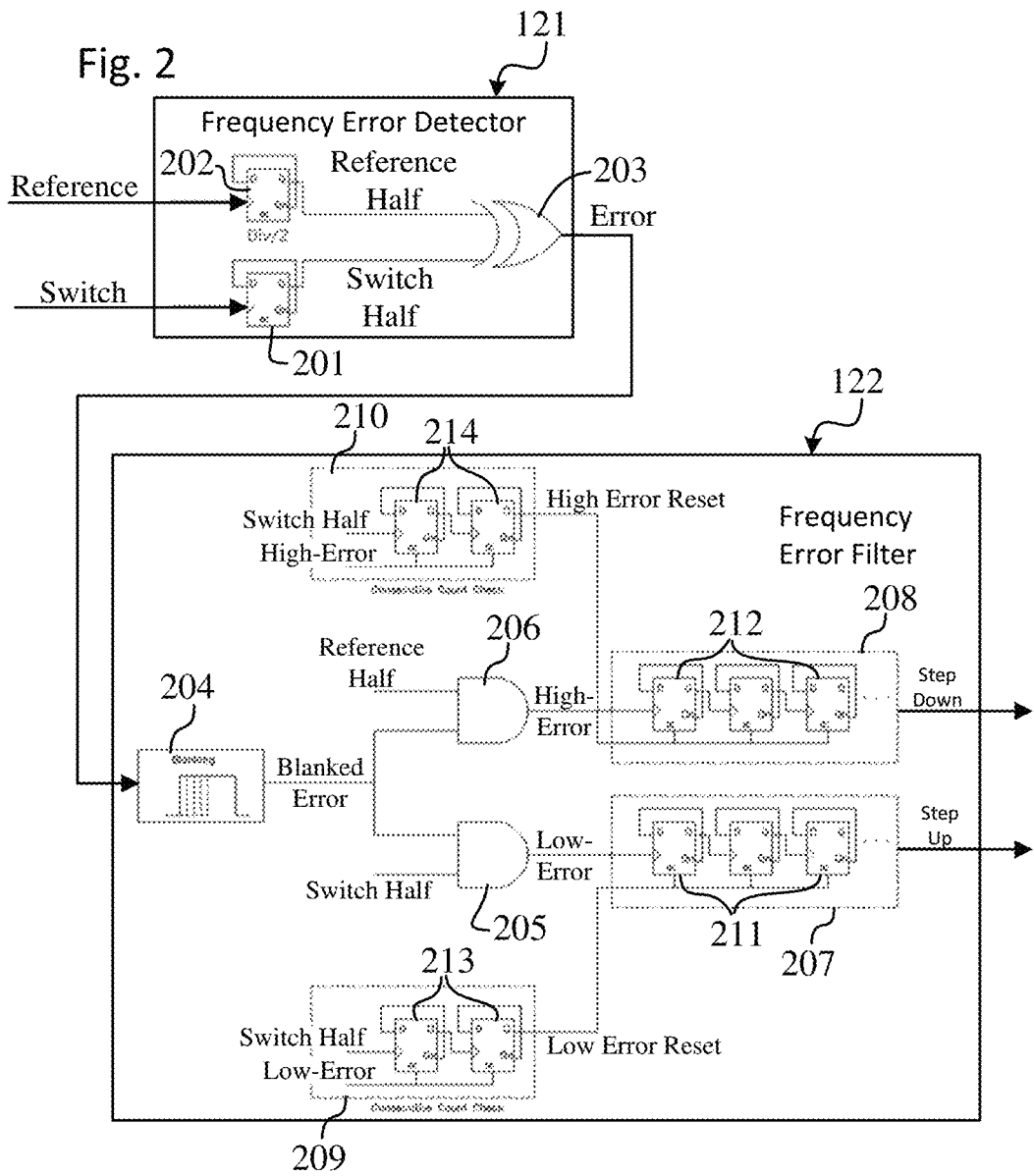
FIG. 2 is a simplified schematic diagram of a portion of a frequency control loop for use in the power converter shown in FIG. 1, in accordance with some embodiments.

FIG. 2 shows additional details of the frequency error detector 121 and the frequency error filter 122, in accordance with some embodiments. The frequency error detector 121 generally includes D flip flops 201 and 202 and an XOR gate 203 connected as shown. The frequency error filter 122 generally includes a signal blanking block 204, low and high AND gates 205 and 206, low and high error pulse counters 207 and 208, and low and high consecutive count check blocks 209 and 210 connected as shown. Additionally, other components may be included in the frequency error detector 121 and/or the frequency error filter 122 but are not shown for simplicity.

The frequency error detector 121 generally receives the switching signal 110 and the reference clock signal or pulse signals (e.g., "switch" and "reference" signals) based on these signals. The switch and reference signals are provided to the D flip flops 201 and 202, respectively, to divide both signals by two ("Div/2") to generate half-frequency signals ("switch half" and "reference half" signals), so that a full period of the signals can be compared. The switch half signal and the reference half signal are passed through the XOR gate 203 to generate the error signal when the switch half signal and the reference half signal do not have the same logic value, as described below with reference to FIGS. 3 and 4. The error signal, thus, overlaps with only one of the switch half and reference half signals. The frequency error detector 121 provides the error signal to the frequency error filter 122.

In some embodiments, the signal blanking block 204 receives the error signal and blanks all or a portion thereof, thereby outputting no error pulse or a reduced-duration error pulse as a blanked error signal. Alternatively, the signal blanking block 204 detects the duration of an on-time of the error signal, outputs the error signal as the blanked error signal only when the pulse of the error signal has a duration longer than a minimum pulse width and does not output any blanked error signal (i.e., blanks all of the error signal) when the pulse of the error signal has a duration shorter than a minimum pulse width. In this manner, error signals that have a pulse width of a relatively short duration are eliminated and not allowed to affect the subsequent components to contribute to the adjustment of the frequency of the switching signal 110. Additionally, by eliminating short duration pulses from the error signal, the signal blanking block 204 provides a hysteresis with respect to adjustments to the switching frequency of the switching signal 110, whereby unnecessary adjustments to the switching frequency are prevented from occurring when the switching frequency is close enough to (i.e., within an acceptable range or tolerance of) the desired reference frequency. The operation of the signal blanking block 204, therefore, adds to or assists with the stability or settling of the switching signal 110. Like the error signal, the blanked error signal overlaps with only one of the switch half and reference half signals. The signal blanking block 204 provides the blanked error signal to the AND gates 205 and 206. For embodiments in which the blanked error signal is a reduced-duration error pulse, if the duration of the blanked error signal is too short for the AND gates 205 and 206 to respond, then the total blanking period is, in effect, longer.

The low AND gate 205 receives the blanked error signal (when it has been produced) and the switch half signal; and the high AND gate 206 receives the blanked error signal (when it has been produced) and the reference half signal.

When the blanked error signal overlaps with the switch half signal, the low and gate 205 generates a low-error signal; and when the blanked error signal overlaps with the reference half signal, the high and gate 206 generates a high-error signal. Since the blanked error signal overlaps with only one of the switch half and reference half signals, either the low-error signal or the high-error signal, but not both, will be produced at any given time. Additionally, when the signal blanking block 204 blanks all of the error signal, there is no blanked error signal, so neither of the low-error signal and the high-error signal is produced in this situation. The low-error signal indicates that the period of the switching signal (or of the switch half signal) is too long (i.e., longer than the period of the reference signal or of the reference half signal) and the frequency of the switching signal is too low (i.e., lower than the frequency of the reference signal); and the high-error signal indicates that the period of the switching signal (or of the switch half signal) is too short (i.e., shorter than the period of the reference signal or of the reference half signal) and the frequency of the switching signal is too high (i.e., higher than the frequency of the reference signal). The low AND gate 205 provides the low-error signal to the low error pulse counter 207; and the high AND gate 206 provides the high-error signal to the high error pulse counter 208.

The low error pulse counter 207 receives the low-error signal (when it has been produced) and generates or produces the step up signal after counting a series of N pulses of the low-error signal. The low error pulse counter 207, therefore, generally includes a series of N D flip flops 211 connected as shown, i.e., with the low-error signal provided to the clock input of the first D flip flop 211, the negative output (Qn) of each D flip flop 211 connected back to the D input thereof, the positive output (Q) connected to the clock input of the next D flip flop 211, and the positive output (Q) of the last D flip flop 211 providing the step up signal. The last of the D flip flops 211, thus, outputs the step up signal after the Nth pulse of the low-error signal causes the first pulse in the series to propagate thereto. The function of the low error pulse counter 207, thus, represents a delay in the producing of the step up signal. Additionally, the high error pulse counter 208 receives the high-error signal (when it has been produced) and generates or produces the step down signal after counting a series of N pulses of the high-error signal. The high error pulse counter 208, therefore, generally includes a series of N D flip flops 212 connected as shown, i.e., with the high-error signal provided to the clock input of the first D flip flop 212, the negative output (Qn) of each D flip flop 212 connected back to the D input thereof, the positive output (Q) connected to the clock input of the next D flip flop 212, and the positive output (Q) of the last D flip flop 212 providing the step down signal. The last of the D flip flops 212, thus, outputs the step down signal after the Nth pulse of the high-error signal causes the first pulse in the series to propagate thereto.

In some situations, it is not desirable to change the switching frequency of the switching signal 110 while the switching frequency is still rapidly swinging below and above the reference frequency immediately after a transient condition has occurred, because changing the switching frequency under this condition could exacerbate the swinging or fluctuations of the switching frequency. It would then potentially take longer for the constant on-time controller 108 and the frequency controller 109 to bring the switching frequency into steady state operation. Therefore, by producing the step up signal or the step down signal only after a count of N pulses of the low-error signal or the high-error signal, respectively, the frequency error filter 122 ensures that the switching frequency of the switch signal 110 has remained steadily too low or too high, respectively, relative to the reference frequency for a sufficiently long amount of time. Due to this count, therefore, it is relatively certain that the switching frequency is not rapidly swinging below and above the reference frequency, as would occur immediately after a transient condition has occurred. The operation of the low and high error pulse counters 207 and 208, thus, adds to or assists with the stability or settling of the switching signal 110.

The value of N, and thus the number of the D flip flops 211 and 212, may depend on the anticipated post-transient settling time for the switching frequency in a particular design, as well as on the length of the period of the switching frequency. Additionally, the number of the count N may depend on the system bandwidth, which is a function of several parameters. The higher the count, the lower the equivalent cutoff frequency of the frequency error filter 122. Acceptable values for N have been determined to be 16 and 32; however, any appropriate integer value between 8 and 64 may be used and may even be higher or lower in some designs. Additionally, since the period of a lower frequency is longer than the period of a higher frequency, a count number (N) for the lower frequency takes a longer time than does the same count number for the higher frequency. However, the anticipated settling time for the switching signal 110 may not have this proportional relationship to the count number, so it may be appropriate to provide one series of the D flip flops 211 and 212 for a given design, but take the step up and step down signals from different flip flops within each series depending on the anticipated settling time for each desired reference frequency. For example, for a first reference frequency, the step up and step down signals may be taken from the Nth (or last) flip flop in the series; whereas, for a second, third or fourth reference frequency, the step up and step down signals may be taken from the Mth, Pth or Qth (i.e., any appropriate intermediate) flip flop in the series, depending on the anticipated settling time for each frequency. In this manner, the count for each frequency may take the same or a different predetermined amount of time as that for the other frequencies. Furthermore, although the number of flip flops 211 and 212 (and, thus, the count number) is shown as being the same for both error pulse counters 207 and 208, it is understood that there could be one number of the flip flops 211 and a second (different) number of the flip flops 212, since the anticipated settling time may be different depending on whether the switching frequency is being stepped up or stepped down.

Additionally, in some situations, the error signal (or the blanked error signal) may include pulses indicating that the switching frequency is too high followed by pulses indicating that the switching frequency is too low (or neither if there are cycles in which the error signal or blanked error signal is not produced) or vice versa. In this situation, if the error signals were nevertheless allowed to propagate through the AND gates 205 and 206 and the flip flops 211 and 212, then it would be possible to produce both the step up signal and the step down signal within just one (or a few) cycles of each other. In this case, the switching frequency would potentially be increased followed relatively quickly by a decrease (or vice versa). Such a situation would potentially add to instability, rather than assist with stability, of the switching signal 110. The low and high consecutive count check blocks 209 and 210 ensure that this situation does not occur.

The low consecutive count check block 209 produces a low error reset signal whenever the low-error signal is not followed immediately by another low-error signal, i.e., consecutive low-error signals do not occur. In this situation, the low-error signal is followed by a high-error signal or neither a high-error signal nor a low-error signal. The low error reset signal is provided to reset (R) inputs of the D flip flops 211 of the low error pulse counter 207. Thus, whenever consecutive low-error signals do not occur, the low error reset signal is produced and causes the D flip flops 211 to reset, thereby resetting the low error pulse counter 207 to zero. (A counting of the N consecutive pulses of the low-error signal is reset when any pulse of the low-error signal is immediately followed by a pulse of the high-error signal.) In this manner, the cooperative operation of the low consecutive count check block 209 with the low error pulse counter 207 ensures that the low error pulse counter 207 generates or produces the step up signal only after counting a series of N consecutive pulses of the low-error signal. Similarly, the high consecutive count check block 210 produces a high error reset signal whenever the high-error signal is not followed immediately by another high-error signal, i.e., consecutive high-error signals do not occur. In this situation, the high-error signal is followed by a low-error signal or neither a low-error signal nor a high-error signal. The high error reset signal is provided to reset (R) inputs of the D flip flops 212 of the high error pulse counter 208. Thus, whenever consecutive high-error signals do not occur, the high error reset signal is produced and causes the D flip flops 212 to reset, thereby resetting the high error pulse counter 208 to zero. (A counting of the N consecutive pulses of the high-error signal is reset when any pulse of the high-error signal is immediately followed by a pulse of the low-error signal.) In this manner, the cooperative operation of the high consecutive count check block 210 with the high error pulse counter 208 ensures that the high error pulse counter 208 generates or produces the step down signal only after counting a series of N consecutive pulses of the high-error signal. This operation is, in effect, an equivalent or similar function of a low bandwidth low pass filter.

The low consecutive count check block 209 includes a series of D flip flops 213 connected as shown, i.e., with the switch half signal provided to the clock input of the first D flip flop 213, the negative output (Qn) of each D flip flop 213 connected back to the D input thereof, the positive output (Q) of the first D flip flop 213 connected to the clock input of the second D flip flop 213, the positive output (Q) of the second D flip flop 213 providing the low error reset signal, and the low-error signal provided to the reset inputs of both D flip flops 213. With each switch half signal, therefore, the D flip flops 213 attempt to count two cycles thereof to output the low error reset signal, but every pulse of the low-error signal resets the D flip flops 213 to prevent the switch half signal from propagating therethrough. However, when consecutive low-error signals do not occur, the D flip flops 213 are not reset, and the switch half signal can propagate therethrough to generate the low error reset signal, which resets the D flip flops 211 of the low error pulse counter 207, as described above. Similarly, the high consecutive count check block 210 includes a series of D flip flops 214 connected as shown, i.e., with the switch half signal provided to the clock input of the first D flip flop 214, the negative output (Qn) of each D flip flop 214 connected back to the D input thereof, the positive output (Q) of the first D flip flop 214 connected to the clock input of the second D flip flop 214, the positive output (Q) of the second D flip flop 214 providing the high error reset signal, and the high-error signal provided to the reset inputs of both D flip flops 214. With each switch half signal, therefore, the D flip flops 214 attempt to count two cycles thereof to output the high error reset signal, but every pulse of the high-error signal resets the D flip flops 214 to prevent the switch half signal from propagating therethrough. However, when consecutive high-error signals do not occur, the D flip flops 214 are not reset, and the switch half signal can propagate therethrough to generate the high error reset signal, which resets the D flip flops 212 of the high error pulse counter 208, as described above. In this manner, the low and high consecutive count check blocks 209 and 210 add to or assist with the stability or settling of the switching signal 110.

Figure 3:
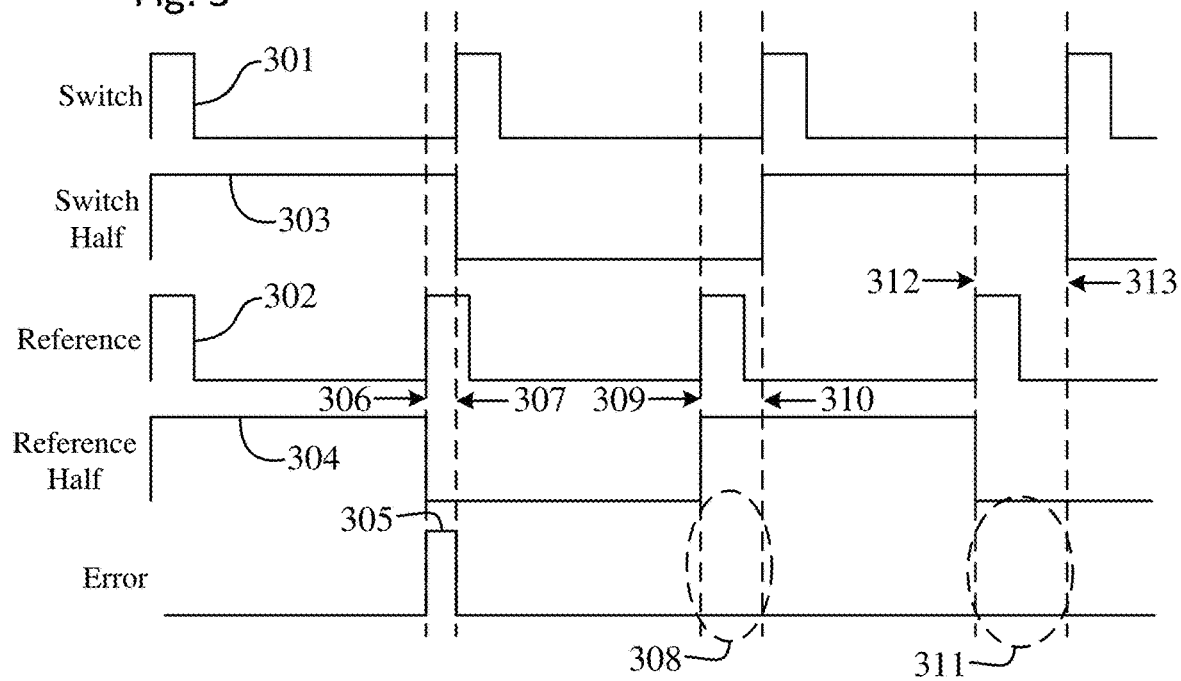
FIGS. 3 and 4 are idealized timing diagrams for portions of the frequency control loop, in accordance with some embodiments.
Figure 4:
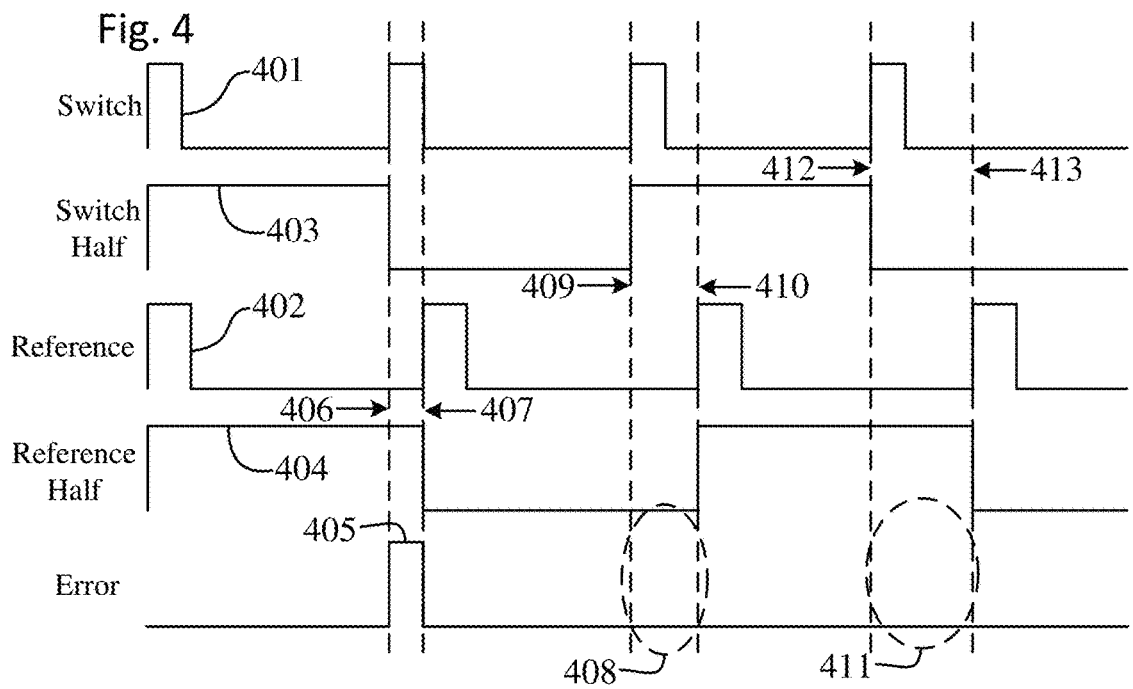

FIGS. 3 and 4 show idealized timing diagrams illustrating an example operation of the frequency error detector 121 for generating or producing the error signal, in accordance with some embodiments. In this example, the switch signal 301/401 and the reference signal 302/402 (e.g., the switch and reference signals input to the frequency error detector 121 in FIG. 2) are represented by pulse signals in each cycle thereof. The operation of the D flip flops 201 and 202 cause a rising edge of the switch half signal 303/403 and the reference half signal 304/404 (with a first pulse of each of the switch signal 301/401 and the reference signal 302/402) and a falling edge of the switch half signal 303/403 and the reference half signal 304/404 (with a second pulse of each of the switch signal 301/401 and the reference signal 302/402). A whole single period of each of the switch signal 301/401 and the reference signal 302/402 is, thus, represented by a single on-time pulse of the switch half signal 303/403 and the reference half signal 304/404, respectively. (In some embodiments, it is not necessary to generate the reference signal 302/402. Instead, it is possible to simply generate the reference half signal 304/404, in some embodiments.)

In FIG. 3, the period of the switch signal 301 is longer than the period of the reference signal 302 (i.e., the frequency of the switch signal 301 is lower than the frequency of the reference signal 302), so the on-time pulse of the switch half signal 303 is longer than the on-time pulse of the reference half signal 304. The operation of the XOR gate 203, thus, generates the error signal (e.g., pulse 305) during the time that the switch half signal 303 and the reference half signal 304 do not both have the same high or low value, i.e., between point 306 (at the falling edge of the reference half signal 304) and point 307 (at the falling edge of the switch half signal 303). In contrast, in FIG. 4, the period of the switch signal 401 is shorter than the period of the reference signal 402 (i.e., the frequency of the switch signal 401 is higher than the frequency of the reference signal 402), so the on-time pulse of the switch half signal 403 is shorter than the on-time pulse of the reference half signal 404. The operation of the XOR gate 203, thus, generates the error signal (e.g., pulse 405) during the time that the switch half signal 403 and the reference half signal 404 do not both have the same high or low value, i.e., between point 406 (at the falling edge of the switch half signal 403) and point 407 (at the falling edge of the reference half signal 404).

The rising edges of the first pulses of each of the switch half signal 303/403 and the reference half signal 304/404 are shown as being synchronized. In this manner, the duration for the pulses 305 and 405 of the error signal between points 306/406 and 307/407 properly represents the error between the periods of the switch signal 301/401 and the reference signal 302/402. On the other hand, the rising edges of the second or subsequent pulses of each of the switch half signal 303/403 and the reference half signal 304/404 are not shown as being synchronized. The frequency controller 109, therefore, includes circuitry for ensuring that pulses of the error signal are not generated within subsequent intervals during which the switch half signal 303/403 and the reference half signal 304/404 do not both have the same high or low value (e.g., at 308 between points 309 and 310, at 311 between points 312 and 313, at 408 between points 409 and 410, and at 411 between points 412 and 413) until rising edges of the switch and reference signals 301/401 and 302/402 or the switch and reference half signals 303/403 and 304/404 can be synchronized again. Additionally, the frequency controller 109 also includes circuitry for periodically performing this synchronization. Since the error between the switch and reference signals 301/401 and 302/402 (or between the switch and reference half signals 303/403 and 304/404) may be relatively large during large frequency swings following transient conditions, it is preferable to wait 2, 3 or 4 cycles (of any one of these signals) before synchronizing the rising edges and generating the pulse 305/405 again. Thus, the frequency error filter 122 is configured to synchronize a first edge of the reference signal with a corresponding first edge of the switching signal immediately prior to a cycle in which the error signal is produced, so that the error signal can be produced at a time period between a second edge of the reference signal and a corresponding second edge of the switching signal.

Figure 5:
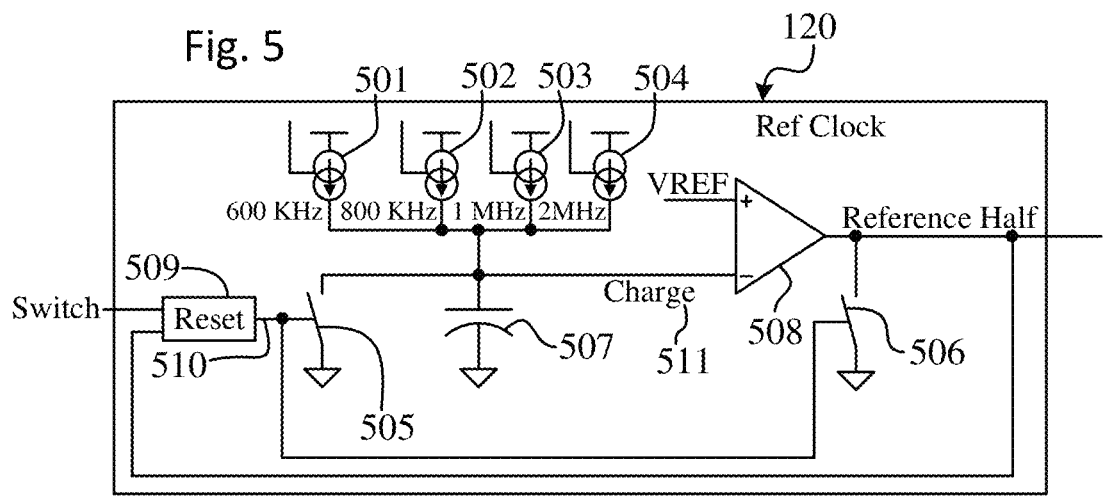
FIG. 5 is a simplified schematic diagram of a reference clock circuit for use in the power converter shown in FIG. 1, in accordance with some embodiments.
Figure 6:
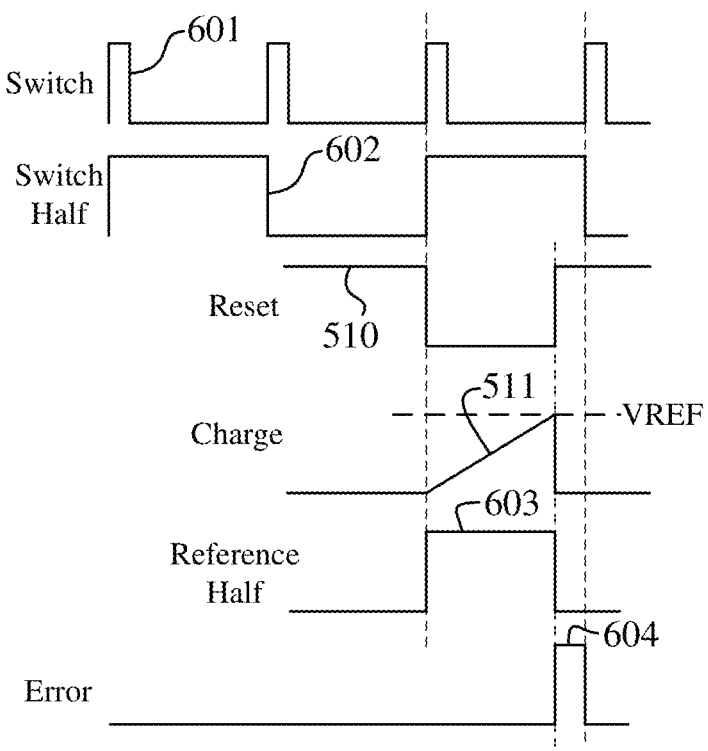
FIGS. 6-10 are additional idealized timing diagrams for portions of the frequency control loop, in accordance with some embodiments.

An example embodiment for periodically synchronizing rising edges of the switch and reference half signals 303/403 and 304/404 is described with respect to FIGS. 5 and 6. In this embodiment, the reference clock 120 generally includes current sources 501, 502, 503 and 504, switches 505 and 506, a capacitor 507, a comparator 508, and a reset signal generator 509 connected as shown in FIG. 5. Additionally, other components may be included in the reference clock 120 but are not shown for simplicity.

The current sources 501, 502, 503 and 504 are provided for each of the desired frequencies (e.g., 600 KHz, 800 KHz, 1 MHz, 2 MHz, respectively) for the switching signal 110 at which the power converter 100 is able to operate. When one or more of the current sources 501, 502, 503 and 504 is activated and the reset switch 505 is open (responsive to a reset signal 510 output low from the reset signal generator 509), the capacitor 507 is charged, such that a charge voltage 511 on the capacitor 507 increases generally linearly. When the reset switch 505 is closed (responsive to the reset signal 510 output high), the capacitor 507 is discharged and the voltage thereon decreases to or toward ground. The charge voltage 511 is provided to a negative input of the comparator 508; and a reference voltage VREF is provided to a positive input of the comparator 508. The comparator 508 outputs the reference half signal. Thus, when the charge voltage 511 is below the reference voltage VREF, the comparator 508 outputs a high voltage for the on-time pulse for the reference half signal, which is pulled low by the switch 506 when the reset signal 510 is output high. When the reset signal 510 is output low, the reset switch 505 is opened, so that the charge voltage 511 rises. Additionally, when the reset signal 510 is output low, the switch 506 is opened, so that the output of the comparator 508 is not pulled low. Thus, at the moment that the switches 505 and 506 are opened, the charge voltage 511 is low (since the capacitor 507 had previously been discharged through the reset switch 505), so the output of the comparator 508 is high. Since the switch 506 is no longer pulling the reference half signal low at this time, the reference half signal goes high. When the charge voltage 511 rises above the reference voltage VREF, the comparator 508 outputs a low voltage for the off-time for the reference half signal. The rising edge of the reference half signal, thus, generally corresponds with opening the switches 505 and 506 and the beginning of the charging of the capacitor 507; and the falling edge of the reference half signal generally corresponds with the charge voltage 511 crossing to above the reference voltage VREF.

Additionally, the reference half signal is fed back to the reset signal generator 509. The reset signal generator 509 receives the reference half signal and the switch signal (or the switch half signal). The reset signal generator 509 includes logic that causes a falling edge of the reset signal 510 to be synchronized with the rising edge of a pulse of the switch signal (or the switch half signal). The reset signal generator 509 further includes logic that causes a rising edge of the reset signal 510 to be synchronized with a falling edge of the reference half signal. Additionally, after the reference half signal falls and the reset signal 510 rises, the reset signal generator 509 further includes logic that prevents the reset signal 510 from falling again for at least 2, 3 or 4 pulses of the switch signal (or the switch half signal), so that the next pulse of the switch signal (or the switch half signal) does not interfere with completion of the current pulse of the reference half signal.

FIG. 6 includes idealized timing diagrams for the switch signal (601), the switch half signal (602), the reset signal 510, the charge voltage 511, a pulse 603 of the reference half signal, and a pulse 604 of the error signal. The reset signal 510 is coordinated or synchronized with the switch signal 601 and/or with the switch half signal 602. This synchronization may be done by basing the reset signal 510 on, or deriving it directly from, the switch signal 601 or the switch half signal 602. Thus, the rising edge of the reset signal 510 is synchronized with the rising edge of the switch signal 601 or the switch half signal 602. When the reset signal 510 turns on (at the rising edge thereof), the capacitor 507 is discharged, and the charge voltage 511 falls below the reference voltage VREF, so the comparator 508 begins to generate the reference half signal, but the switch 506 pulls the reference half signal low, so the pulse 603 thereof is not generated yet. (Alternatively, the reset signal 510 can be inverted and ANDed with the output of the comparator 508 to produce the pulse 603 of the reference half signal.) When the reset signal 510 turns off (at the falling edge thereof), the pulse 603 of the reference half signal is generated (a rising edge thereof, as explained above), the capacitor 507 begins to charge, and the charge voltage 511 rises accordingly. When the charge voltage 511 rises above the reference voltage VREF, the comparator 508 ends the pulse 603 of the reference half signal (falling edge of the pulse), and the reset signal 510 is caused to go high again (discharging the capacitor 507 again).

In this example, the period of the switch signal 601 (i.e., a pulse of the switch half signal 602) is longer than the pulse 603 of the reference half signal, so the pulse 604 of the error signal is generated accordingly. Since it may be unknown how different the switch signal 601 or the switch half signal 602 is from the reference half signal, it is desirable to wait 1, 2, 3 or 4 cycles before generating the reset signal 510 again in order to ensure that the whole pulse 603 of the reference half signal can occur before the next such pulse. In some embodiments, the reset signal 510 is generated 1 out of every 4 cycles of the switch signal 601.

Figure 7:
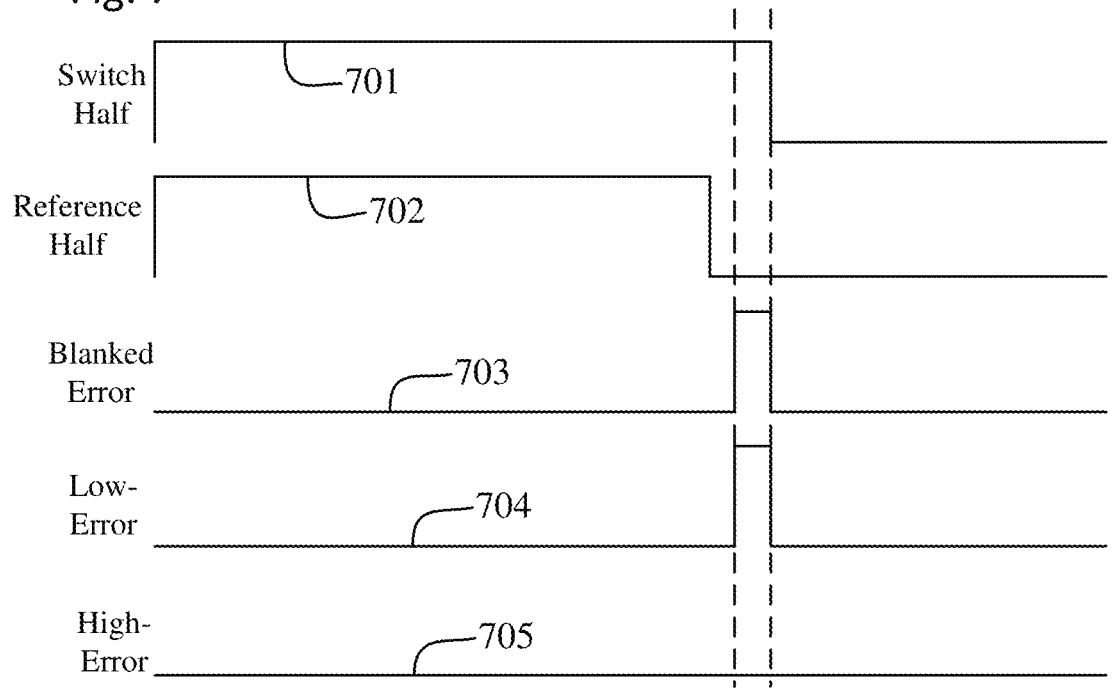
Figure 8:
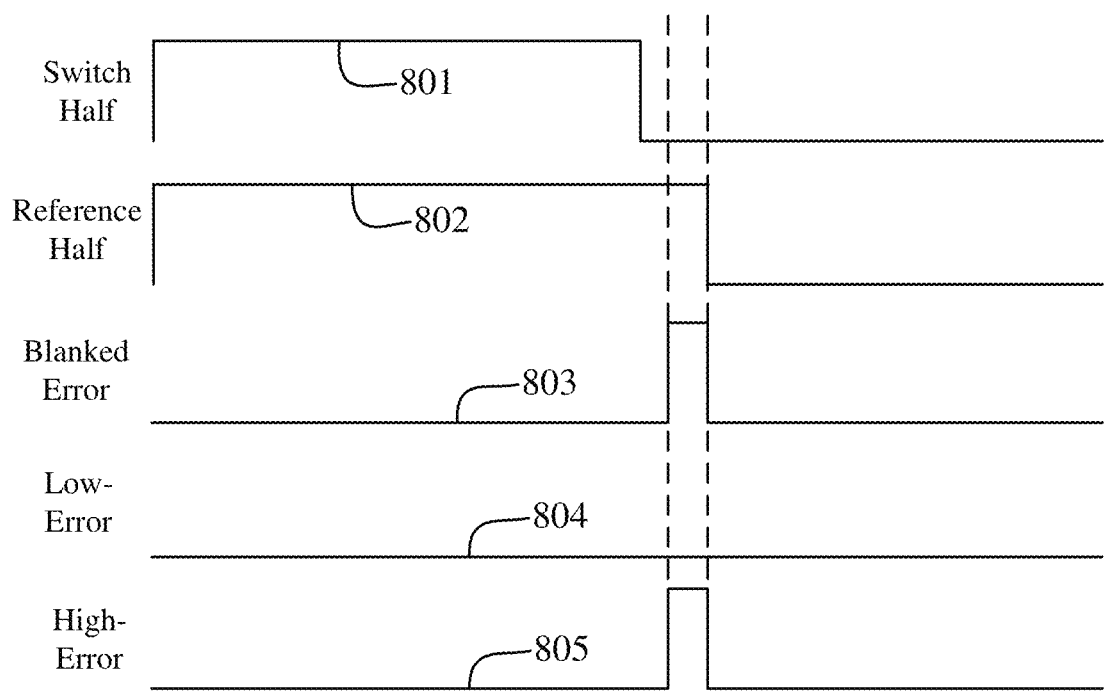

FIGS. 7 and 8 show timing diagrams that illustrate example operations of the signal blanking block 204 and the AND gates 205 and 206 of FIG. 2. Example timing diagrams are thus shown for the switch half signal (701/801), the reference half signal (702/802), the blanked error signal (703/803), the low-error signal (704/804), and the high-error signal (705/805). In this example, the signal blanking block 204 blanks a portion of the error signal, but the error signal is larger than the blanked portion, so the remaining portion of the blanked error signal 703/803 fills just a portion of the region between the falling edges of the reference half signal 702/802 and the switch half signal 701/801. In the alternative mentioned above, since the pulse of the error signal has a duration longer than a minimum pulse width, the blanked error signal would not be reduced significantly, if at all. Additionally, in the example of FIG. 7, since the pulse of the blanked error signal 703 overlaps with the switch half signal 701, a pulse of the low-error signal 704 is generated by the AND gate 205, and the high-error signal 705 has no pulse. Furthermore, in the example of FIG. 8, since the pulse of the blanked error signal 803 overlaps with the reference half signal 802, a pulse of the high-error signal 805 is generated by the AND gate 206, and the low-error signal 804 has no pulse.

Figure 9:
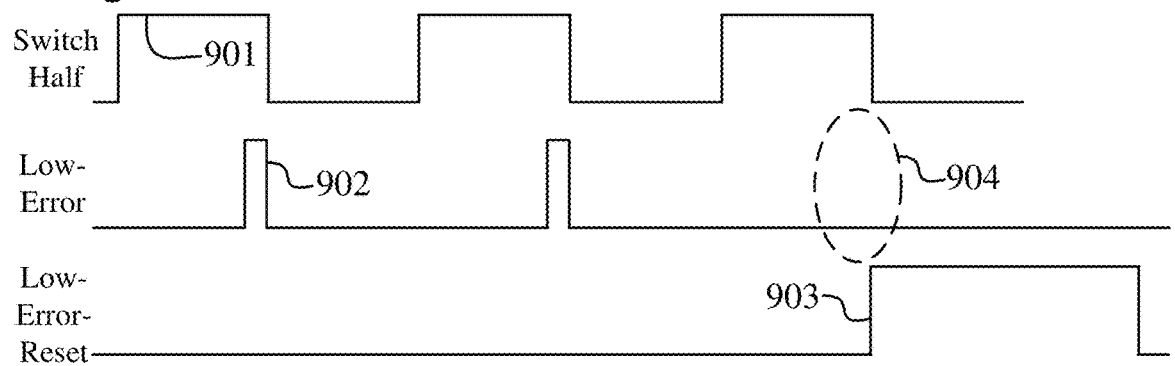
Figure 10:
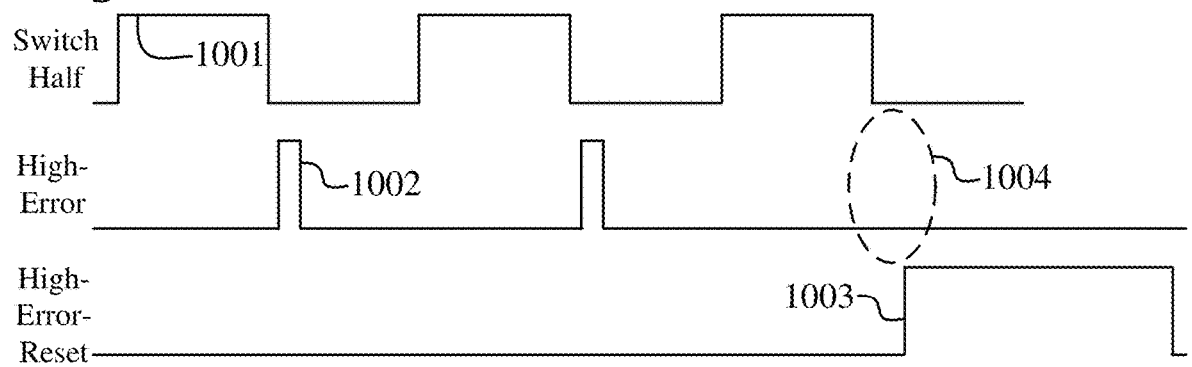

FIGS. 9 and 10 show timing diagrams that illustrate example operations of the low and high consecutive count check blocks 209 and 210 of FIG. 2 for ensuring consecutive counts of a same polarity error. Example timing diagrams are thus shown for the switch half signal (901/1001), the low-error signal (902), the low-error reset signal (903), the high-error signal (1002), and the high-error reset signal (1003). In the example of FIG. 9, three pulses of the switch half signal 901 are shown, and corresponding pulses of the low-error signal 902 are generated for the first two. At the third pulse of the switch half signal 901, however, there is no corresponding pulse of the low-error signal 902 (at region 904), which assumes that either a pulse of the high-error signal was generated at this point or a pulse for neither the low-error nor the high-error signal was generated at this point. In this case, the low consecutive count check block 209 generates a pulse of the low-error reset signal, as described above, to reset the D flip flops 211 of the low error pulse counter 207. On the other hand, in the example of FIG. 10, three pulses of the switch half signal 1001 are again shown, and corresponding pulses of the high-error signal 1002 are generated for the first two. At the third pulse of the switch half signal 1001, however, there is no corresponding pulse of the high-error signal 1002 (at region 1004), which assumes that either a pulse of the low-error signal was generated at this point or a pulse for neither the high-error nor the low-error signal was generated at this point. In this case, the high consecutive count check block 210 generates a pulse of the high-error reset signal, as described above, to reset the D flip flops 212 of the high error pulse counter 208.

Figure 11:
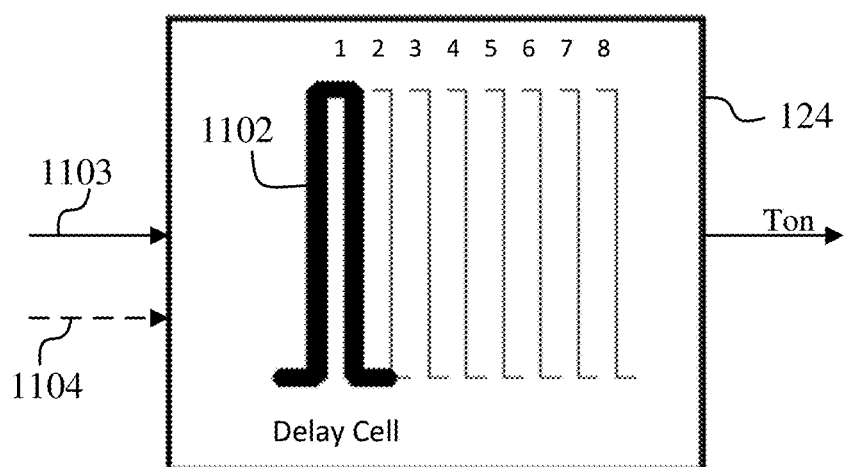
FIG. 11 is a simplified representation of a digital Ton pulse generator for use in the power converter shown in FIG. 1, in accordance with some embodiments.

FIG. 11 illustrates an embodiment for the pulse generator 124 of FIG. 1. Other embodiments my generate the on-time pulse Ton in any other appropriate manner.

The pulse generator 124 of FIG. 11, for example, is a digital Ton pulse generator (e.g., with a delay cell) that generates the on-time pulse Ton with small steps (up and down) based on small individual pulse widths 1102. The pulse generator 124, therefore, generates discrete on-time pulses Ton with widths that are an appropriate integer number multiple of the small individual pulse width steps based on the count signal (1103) from the up/down counter 123. The small individual pulse width steps are relatively very small in order to provide for a relatively fine tune capability for adjusting the width of the on-time pulse Ton. Additionally, in some embodiments, the look up table 126 generally sets the initial width of the on-time pulse Ton (e.g., either directly via an initial Ton width value 1104 provided from the look up table 126 to the pulse generator 124 or indirectly via the up/down counter 123), and the small individual pulse width steps are based on (e.g., may be a predetermined fraction of) the width of the initial on-time pulse Ton.

Figure 12:
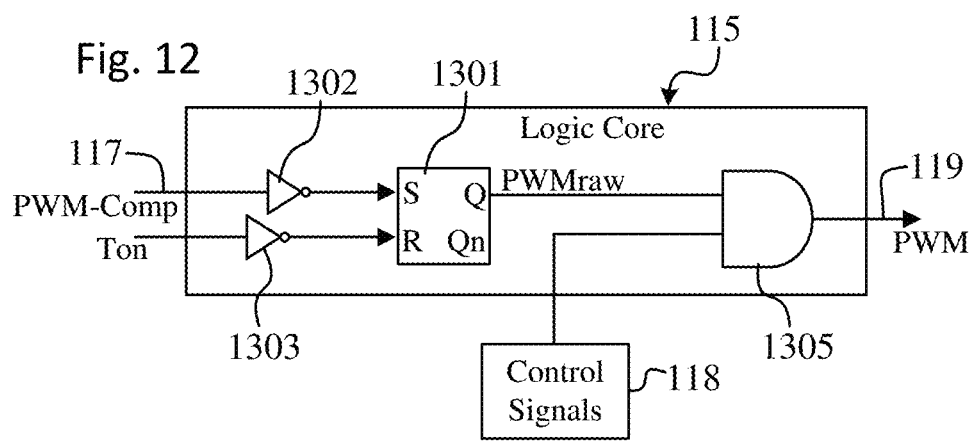
FIG. 12 is a simplified schematic diagram of a logic core for generating a pulse width modulation (PWM) signal for use in the power converter shown in FIG. 1, in accordance with some embodiments.
Figure 13:
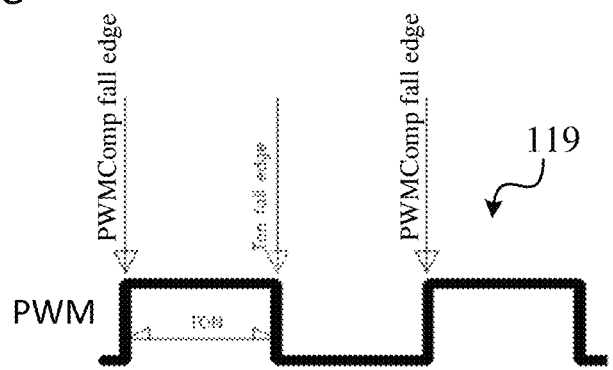
FIG. 13 is a simplified idealized timing diagram of a PWM signal for use in the power converter shown in FIG. 1, in accordance with some embodiments.

FIG. 12 illustrates an example embodiment for the logic core 115; and FIG. 13 illustrates the operation thereof. In this embodiment, the logic core 115 generally includes an S-R latch (flip flop) 1301, inverters 1302 and 1303, and an AND gate 1305 connected as shown. Additionally, other components may be included in the logic core 115 but are not shown for simplicity.

The falling edge of the PWM-Comp signal and the rising edge of the on-time pulse Ton are synchronized by logic (not shown). The PWM-Comp signal at the comparator output 117 is inverted by the inverter 1302, and the inverted PWM-Comp signal is provided to a set (S) input of the S-R latch 1301. Additionally, the on-time pulse Ton is inverted by the inverter 1303, and the inverted on-time pulse Ton is provided to a reset (R) input of the S-R latch 1301. A raw PWM signal (PWMraw signal) is generated at the positive output (Q) of the S-R latch 1301 and is provided to an input of the AND gate 1305. One or more additional inputs of the AND gate 1305 receive the control signals 118 (FIG. 1) or combinations thereof. Thus, when the control signals 118 are activated, the AND gate 1305 generates a rising edge of the PWM-signal 119 at the falling edge of the PWM-Comp signal at 117 (PWMComp fall edge or inverted PWMCOMP rise edge), and the AND gate 1305 generates a falling edge of the PWM-signal 119 at the falling edge of the on-time pulse Ton (Ton fall edge or inverted Ton rise edge), via the PWMraw signal, as shown by the PWM-signal 119 in FIG. 13. The on-time of the on-time pulse Ton is thus represented in the pulses of the PWM-signal 119.

The various control signals 118 (FIG. 1) generally provide for a minimum on time and a minimum off time for the PWM-signal 119, an enable control (EN), a test logic control, a ZCD (zero cross detection) control for DCM (DisContinous Mode) operation, a power good (PGOOD) control, undervoltage (UVLO) protection, overvoltage (OTP) protection, and thermal monitoring, among other potential control signals. As long as these control signals are set, the AND gate 1305 is controlled by the PWMraw signal. Under fault conditions, therefore, the switching signal can be disabled.

Figure 14:
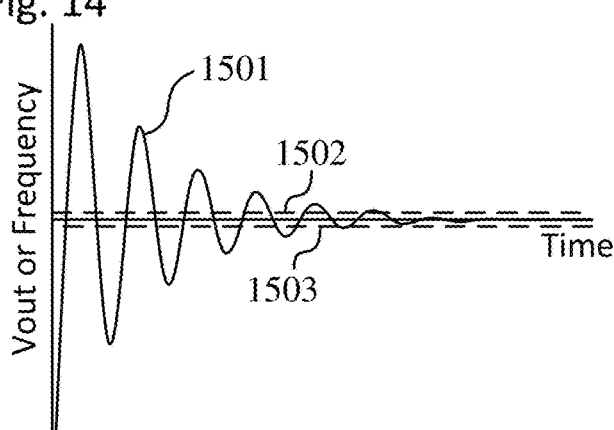
FIG. 14 is an idealized voltage or frequency vs time diagram illustrating operation of the frequency control loop, in accordance with some embodiments.

FIG. 14 shows an idealized voltage or frequency vs time diagram 1501 illustrating a "valid" error window for the operation of the frequency control loop, in accordance with some embodiments. Following each step in the adjustment of the on-time pulse Ton and the switching frequency, the voltage and/or frequency of the switching signal swings as shown, with negative errors below the midline and positive errors above the midline, and with the errors steadily decreasing until they are within the hysteresis range of the signal blanking block 204 (indicated by dashed lines 1502 and 1503), at which point errors will not be detected due to the blanking. The blanking by the signal blanking block 204, thus, performs a hysteresis to remove small errors, so that the switching frequency will not experience jitter that would otherwise occur due to small noise that could cause the up/down counter 123 to toggle unnecessarily between adjacent steps. Additionally, the error counts by the low and high error pulse counters 207 and 208 generally performs a low pass filtering (LPF) effect. In time domain, therefore, if the duration of an error in the switching frequency does not exceed an error count window, the error will not be detected and the algorithm of the frequency error filter 122 will not cause the up/down counter 123 to increment or decrement the count signal. In this example, the negative and positive error is shorter than the valid error window, so no step up or step down counter pulse would be generated. By using the consecutive count of same polarity error described above (dependent on a system loop bandwidth), a very effective digital low pass filter is thus realized by the frequency error filter 122 with relatively few components. (An analog LPF, by comparison, would require a much larger physical area in an integrated circuit die.) Since the low and high error pulse counters 207 and 208 are clocked based on the switching frequency, the equivalent low pass cutoff frequency is relative to the switching frequency, i.e., a lower frequency has a longer period, which results in a higher cutoff frequency, and a higher frequency has a shorter period, which results in a lower cutoff frequency. Thus, the cut off frequency of the frequency error filter 122 self-tracks with the switching frequency, so it can be used in a design that allows for a variable switching frequency.

Figure 15:
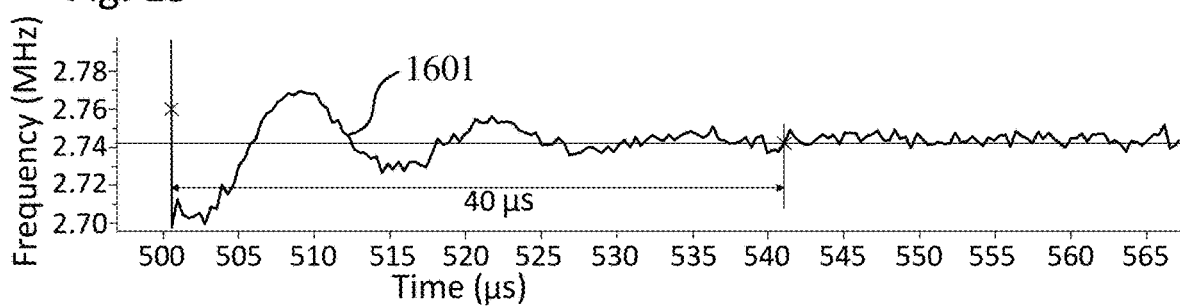
FIGS. 15-19 are simulated voltage and frequency vs time diagrams illustrating operation of the frequency control loop, in accordance with some embodiments.

FIG. 15 shows a frequency vs time diagram 1601 for a switching signal generated by a simulation of an embodiment of the power converter 100. After a transient condition, the switching frequency swings until it settles to a steady state. In this example, sufficient settling had occurred by about 40 μs after the transient. Additionally, during this response period, the output voltage Vout and the frequency thereof will oscillate within a decaying envelope and then settle to a steady state value.

Figure 16:
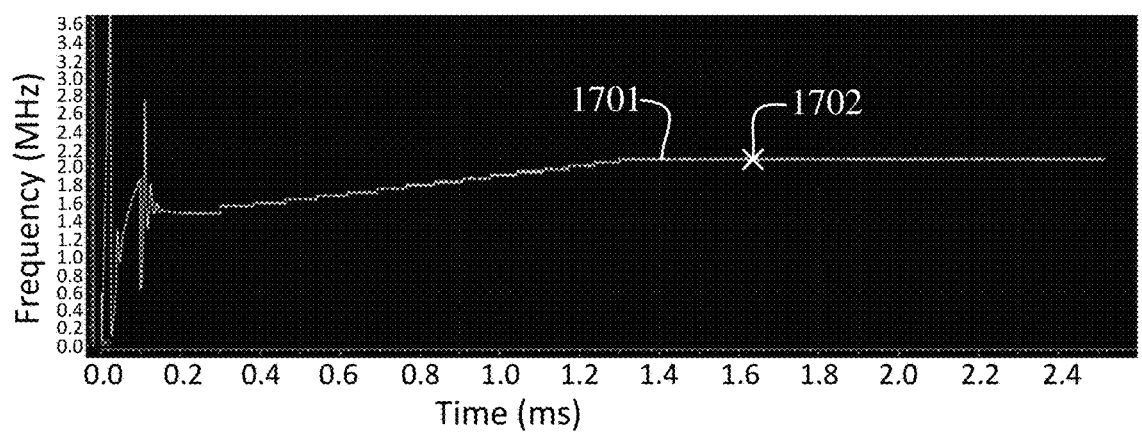

FIG. 16 shows a frequency vs time diagram 1701 for a switching signal generated by a simulation of another embodiment of the power converter 100. In this example, the desired reference frequency was about 2 MHz. Sufficient settling of the switching frequency was considered to have occurred after about 1.63 ms (about at point 1702) with a resulting switching frequency at about 2.079 MHz after stepping up the frequency.

Figure 17:
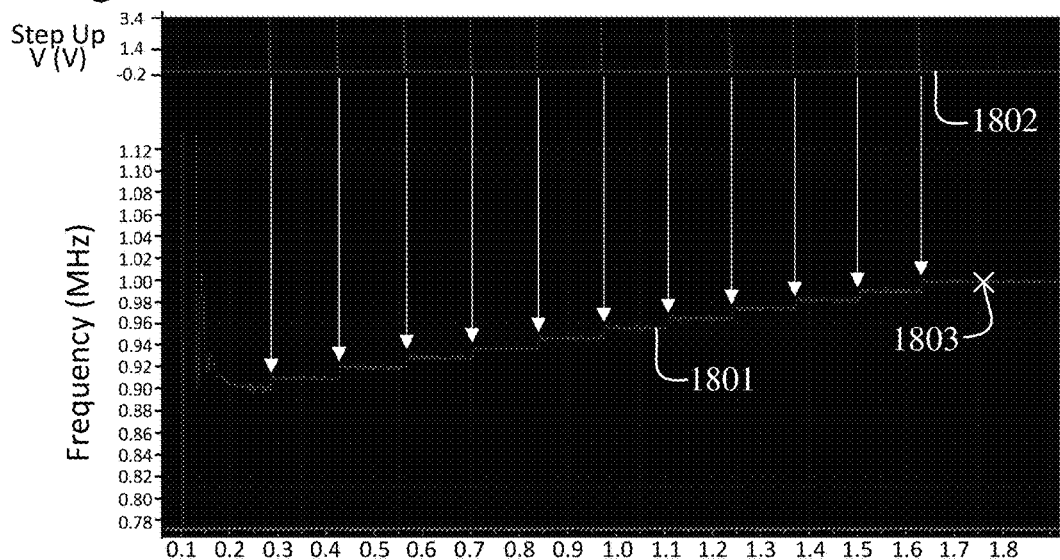

FIG. 17 shows a frequency vs time diagram 1801 for a switching signal and a voltage vs time diagram 1802 for a corresponding step up signal generated by a simulation of another embodiment of the power converter 100. The steps in the switching signal are shown (by arrows) to correspond with the pulses of the step up signal. In this example, the desired reference frequency was about 1 MHz. Sufficient settling of the switching frequency was considered to have occurred after about 1.76 ms (about at point 1803, and the step up pulses have stopped) with a resulting switching frequency at about 1.001 MHz.

Figure 18:
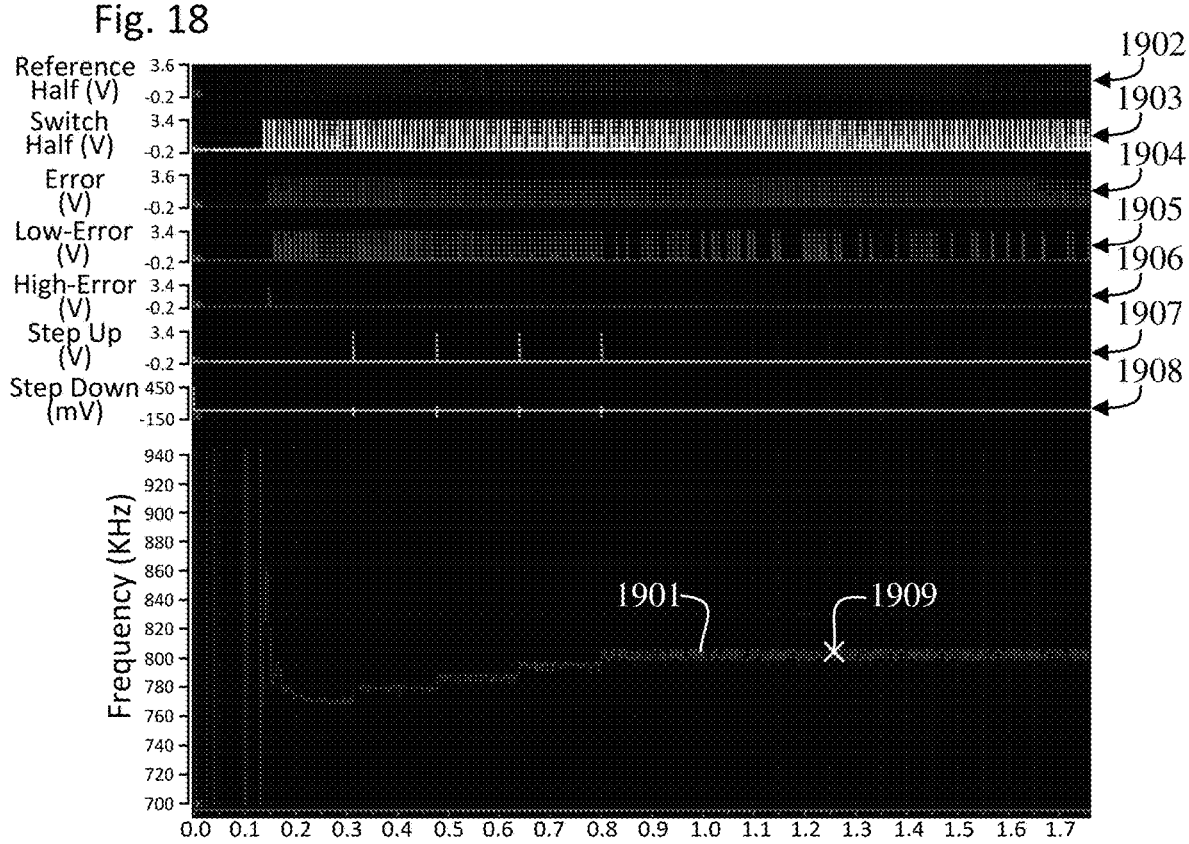

FIG. 18 shows a frequency vs time diagram for a switching signal (1901) and voltage vs time diagrams for the reference half signal (1902), the switch half signal (1903), the error signal (1904), the low-error signal (1905), the high-error signal (1906), the step up signal (1907), and the step down signal (1908) generated by a simulation of another embodiment of the power converter 100. The pulses of the reference half signal 1902 are shown to correlate with the pulses of the switch half signal 1903, because the pulses of the reference half signal have been synchronized therewith. Only one out of every four pulses of the switch half signal and the reference half signal are shown, because the rest have been blanked. The error signal 1904 is shown correlated with the reference half signal 1902 and the switch half signal 1903. Since the switching frequency was too low (as shown by diagram 1901), the pulses for the low-error signal 1905 are shown to have been generated, and pulses for the high-error signal 1906 are shown not to have been generated, except for one stray high-error pulse at the beginning. Additionally, the count in this example was 16, so the pulses of the step up signal 1907 are shown to have been generated after every 16 pulses of the low-error signal 1905. The pulses of the step up signal 1907 are shown to continue until gaps appear in the pulses of the low-error signal 1905, after which point no more pulses in the step up signal 1907 occur, since the low consecutive count check block 209 started to reset the low error pulse counter 207 after this point due to the failure to continue to produce consecutive pulses for the low-error signal 1905. The step down signal 1908 is shown to exhibit minor fluctuations in the millivolt range, but these are too small to have had an effect. The steps in the switching signal 1901, thus, correspond with the pulses of the step up signal 1907. In this example, the desired reference frequency was about 800 KHz. Sufficient settling of the switching frequency was considered to have occurred after about 1.26 ms (about at point 1909, and the step up pulses have stopped) with a resulting switching frequency at about 805.3 KHz.

Figure 19:
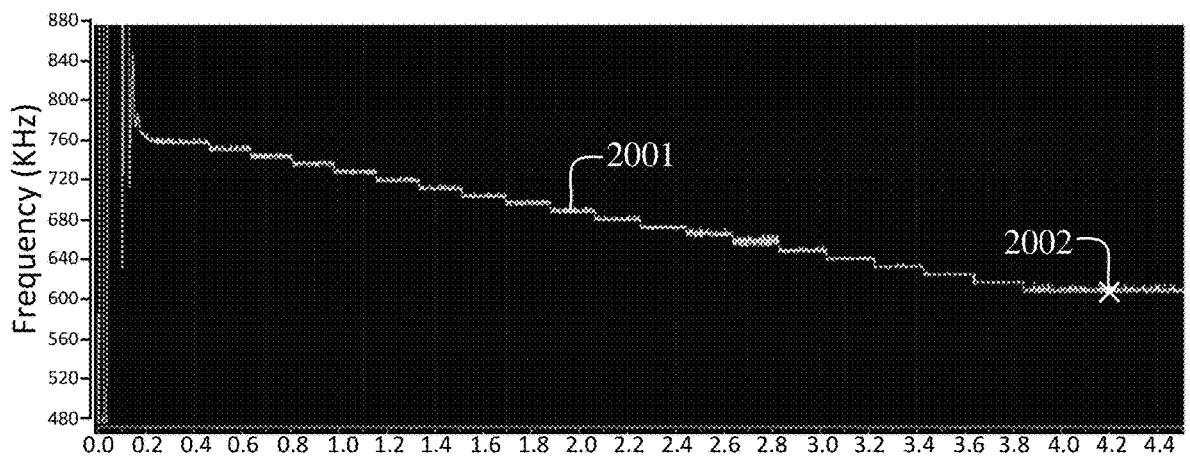

FIG. 19 shows a frequency vs time diagram 2001 for a switching signal generated by a simulation of another embodiment of the power converter 100. In this example, the desired reference frequency was about 600 KHz. Sufficient settling of the switching frequency was considered to have occurred after about 4.19 ms (about at point 2002) with a resulting switching frequency at about 606.2 KHz after stepping down the frequency.

FIGS. 15-19, thus, illustrate relatively efficient, rapid and stable responses of the simulations for the power converter 100, in accordance with some embodiments.

As used herein, the term "constant" or "fixed" is relative. Due to non-idealities, nothing is ever exact in the real world. Instead, values or parameters are considered to be constant or fixed if they oscillate, fluctuate or change only within an acceptably small range or tolerance.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A frequency controller comprising:
   a frequency error detector producing an error signal indicating that a switching frequency is not equal to a reference frequency;
   a filter configured to produce a step up signal and a step down signal based on the error signal;
   a counter producing a count signal and configured to increase the count signal in response to the step up signal and to decrease the count signal in response to the step down signal; and a pulse generator producing an on-time pulse having a duration that is related to a value of the count signal, the pulse generator providing the on-time pulse to a constant on-time feedback loop to control a constant on-time of an on-time signal generated by the constant on-time feedback loop and to maintain the switching frequency at about the reference frequency.

2. The frequency controller of claim 1, wherein:
the filter is further configured to produce the step up signal based on an overlap of the error signal and a switching signal having a frequency based on the switching frequency and to produce the step down signal based on an overlap of the error signal and a reference signal having a frequency based on the reference frequency.

3. The frequency controller of claim 2, wherein:
the filter is further configured to produce a low-error signal when the error signal and the switching signal overlap, the low-error signal indicates that the switching frequency is lower than the reference frequency, and the step up signal is produced based on the low-error signal; and
the filter is further configured to produce a high-error signal when the error signal and the reference signal overlap, the high-error signal indicates that the switching frequency is higher than the reference frequency, and the step down signal is produced based on the high-error signal.

4. The frequency controller of claim 3, wherein:
the step up signal is produced after N pulses of the low-error signal; and
the step down signal is produced after N pulses of the high-error signal.

5. The frequency controller of claim 4, wherein:
a counting of the N pulses of the low-error signal is reset when any pulse of the low-error signal is immediately followed by a pulse of the high-error signal; and
a counting of the N pulses of the high-error signal is reset when any pulse of the high-error signal is immediately followed by a pulse of the low-error signal.

6. The frequency controller of claim 5, wherein:
the filter is further configured to synchronize a first edge of the reference signal with a corresponding first edge of the switching signal immediately prior to a cycle of the switching signal in which the error signal is produced; and
the error signal is produced at a time period between a second edge of the reference signal and a corresponding second edge of the switching signal.

7. A power converter comprising:
an output at which an output voltage is produced;
a power switch through which power is produced for the output voltage in response to an activation signal that has an on-time and a switching frequency;
a constant on-time feedback loop receiving a feedback signal from the output and generating an on-time signal in response to the feedback signal, the on-time signal having a constant on-time and controlling the on-time of the activation signal;
a counter producing a count signal and configured to increase and to decrease a value of the count signal based on the switching frequency not being equal to a reference frequency; and
a pulse generator producing an on-time pulse having a duration that is related to the value of the count signal, the pulse generator providing the on-time pulse to the constant on-time feedback loop to control the constant on-time of the on-time signal and to maintain the switching frequency at about the reference frequency.

8. The power converter of claim 7, further comprising:
a supply voltage with which the output voltage is produced; and
a look up table that produces an on-time width value based on the output voltage and the supply voltage;
and wherein:
the counter resets the value of the count signal based on the on-time width value in response to a change in the on-time width value.

9. The power converter of claim 8, further comprising:
a sigma delta analog-to-digital converter (ADC) that generates a digital output based on the output voltage and the supply voltage;
and wherein:
the look up table produces the on-time width value based on the digital output of the sigma delta ADC.

10. The power converter of claim 7, further comprising:
a supply voltage with which the output voltage is produced; and
a look up table that produces an on-time width value based on the output voltage and the supply voltage;
and wherein:
the pulse generator resets the duration of the on-time pulse based on the on-time width value in response to a change in the on-time width value.

11. The power converter of claim 7, wherein:
the pulse generator is a digital pulse generator that generates the on-time pulse with a width that is an integer number multiple of an individual pulse width; and
the integer number multiple is based on the value of the count signal.

12. The power converter of claim 11, further comprising:
a supply voltage with which the output voltage is produced; and
a look up table that produces an on-time width value based on the output voltage and the supply voltage;
and wherein:
the individual pulse width is based on the on-time width value.

13. The power converter of claim 7, further comprising:
a filter configured to produce a step up signal and a step down signal based on the switching frequency not being equal to the reference frequency;
and wherein:
the counter increases the count signal in response to the step up signal and decreases the count signal in response to the step down signal.

14. A method comprising:
generating an output voltage by a power switch of a power converter in response to an activation signal that has an on-time and a switching frequency;
providing a feedback signal based on the output voltage;
generating an on-time signal based on the feedback signal, the on-time signal having a constant on-time;
controlling, based on the on-time signal, the on-time of the activation signal;
producing a count signal by increasing or decreasing a value of the count signal based on whether the switching frequency is lower than or greater than, respectively, a reference frequency;
producing an on-time pulse having a duration that is related to the value of the count signal; and
controlling, based on the on-time pulse, the constant on-time of the on-time signal, the controlling of the constant on-time resulting in maintaining the switching frequency at about the reference frequency.

15. The method of claim 14, further comprising:
producing, from a look up table, an on-time width value based on the output voltage and a supply voltage with which the output voltage is produced; and
resetting the value of the count signal based on the on-time width value in response to a change in the on-time width value.

16. The method of claim 15, further comprising:
generating, by a sigma delta analog-to-digital converter (ADC), a digital output based on the output voltage and the supply voltage; and
producing, from the look up table, the on-time width value based on the digital output of the sigma delta ADC.

17. The method of claim 14, further comprising:
producing, from a look up table, an on-time width value based on the output voltage and a supply voltage with which the output voltage is produced; and
resetting the duration of the on-time pulse based on the on-time width value in response to a change in the on-time width value.

18. The method of claim 14, further comprising:
generating, by a digital pulse generator, the on-time pulse with a width that is an integer number multiple of an individual pulse width, the integer number multiple being based on the value of the count signal.

19. The method of claim 18, further comprising:
producing, from a look up table, an on-time width value based on the output voltage and a supply voltage with which the output voltage is produced;
and wherein:
the individual pulse width is based on the on-time width value.

20. The method of claim 14, further comprising:
producing a step up signal and a step down signal based on whether the switching frequency is lower than or greater than the reference frequency; and
producing the count signal by increasing the value of the count signal in response to the step up signal or decreasing the value of the count signal in response to the step down signal.

* * * * *